United States Patent
Ouellette et al.

(10) Patent No.: US 11,770,979 B2
(45) Date of Patent: Sep. 26, 2023

(54) CONDUCTIVE ALLOY LAYER IN MAGNETIC MEMORY DEVICES AND METHODS OF FABRICATION

(71) Applicant: Intel Corporation, Santa Clara, CA (US)

(72) Inventors: Daniel Ouellette, Portland, OR (US); Justin Brockman, Portland, OR (US); Tofizur Rahman, Portland, OR (US); Angeline Smith, Hillsboro, OR (US); Andrew Smith, Hillsboro, OR (US); Christopher Wiegand, Portland, OR (US); Oleg Golonzka, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1034 days.

(21) Appl. No.: 16/024,427

(22) Filed: Jun. 29, 2018

(65) Prior Publication Data

US 2020/0006632 A1    Jan. 2, 2020

(51) Int. Cl.
*H01F 10/32* (2006.01)
*G11C 11/16* (2006.01)
(Continued)

(52) U.S. Cl.
CPC ......... *H10N 50/80* (2023.02); *H01F 10/3286* (2013.01); *H10B 61/22* (2023.02);
(Continued)

(58) Field of Classification Search
CPC ......... H01L 45/1253; G11C 2211/5615; G11C 11/161; H10N 50/10; G01R 33/098; G11B 5/3909
See application file for complete search history.

(56) References Cited

U.S. PATENT DOCUMENTS 7,098,495 B2    8/2006  Sun et al.
8,254,162 B2    8/2012  Butler
(Continued)

FOREIGN PATENT DOCUMENTS

WO    WO-2017052635 A1  *  3/2017  ........... G11C 11/161

OTHER PUBLICATIONS

Notice of Allowance from European Patent Application No. 19176632.8 dated Nov. 17, 2020, 7 pgs.
(Continued)

*Primary Examiner* — Didarul A Mazumder
*Assistant Examiner* — Gustavo G Ramallo
(74) *Attorney, Agent, or Firm* — Essential Patents Group, LLP

(57) ABSTRACT

A memory device includes a bottom electrode, a conductive layer such as an alloy including ruthenium and tungsten above the bottom electrode and a perpendicular magnetic tunnel junction (pMTJ) on the conductive layer. In an embodiment, the pMTJ includes a fixed magnet, a tunnel barrier above the fixed magnet and a free magnet on the tunnel barrier. The memory device further includes a synthetic antiferromagnetic (SAF) structure that is ferromagnetically coupled with the fixed magnet to pin a magnetization of the fixed magnet. The conductive layer has a crystal texture which promotes high quality FCC <111> crystal texture in the SAF structure and improves perpendicular magnetic anisotropy of the fixed magnet.

14 Claims, 11 Drawing Sheets

(51) Int. Cl.
*H10N 50/01* (2023.01)
*H10N 50/80* (2023.01)
*H10B 61/00* (2023.01)
*H10N 50/85* (2023.01)

(52) U.S. Cl.
CPC ........ *G11C 11/161* (2013.01); *H01F 10/3272* (2013.01); *H10N 50/01* (2023.02); *H10N 50/85* (2023.02)

(56) References Cited

U.S. PATENT DOCUMENTS

| | | | |
|---|---|---|---|
| 8,476,722 B2 | 7/2013 | Lee | |
| 9,269,888 B2 * | 2/2016 | Meade | H01L 43/10 |
| 10,014,465 B1 * | 7/2018 | Liu | G11C 11/161 |
| 10,388,343 B2 * | 8/2019 | Oikawa | G11C 11/1675 |
| 10,453,510 B2 * | 10/2019 | Park | H01L 43/12 |
| 2012/0126905 A1 | 5/2012 | Zhang et al. | |
| 2012/0163070 A1 | 6/2012 | Nagase et al. | |
| 2014/0021426 A1 | 1/2014 | Lee et al. | |
| 2014/0269035 A1 | 9/2014 | Manipatruni et al. | |
| 2014/0306302 A1 | 10/2014 | Guenole et al. | |
| 2015/0137287 A1 | 5/2015 | Kim et al. | |
| 2015/0171316 A1 | 6/2015 | Park et al. | |
| 2015/0295164 A1 | 10/2015 | Sandhu et al. | |
| 2015/0340601 A1 * | 11/2015 | Huai | H01L 43/10 257/421 |
| 2016/0155932 A1 * | 6/2016 | Chen | G11C 11/161 257/427 |
| 2017/0125664 A1 * | 5/2017 | Tahmasebi | H01L 43/02 |
| 2018/0294477 A1 * | 10/2018 | Shin | H01M 4/366 |
| 2021/0296575 A1 * | 9/2021 | Kim | H10N 50/10 |

OTHER PUBLICATIONS

Extended European Search Report from European Patent Application No. 19176632.8 dated Oct. 30, 2019, 8 pgs.

* cited by examiner

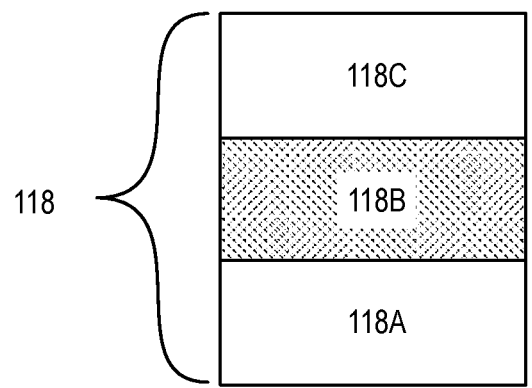
FIG. 1G
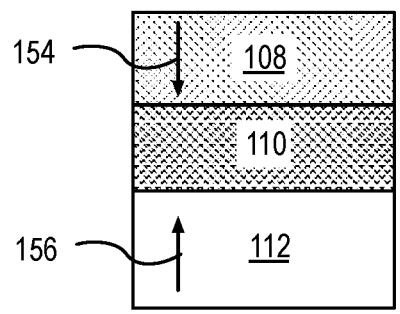
FIG. 1H
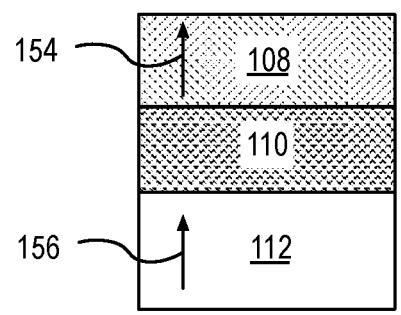
FIG. 1I
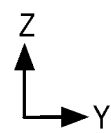

CONDUCTIVE ALLOY LAYER IN MAGNETIC MEMORY DEVICES AND METHODS OF FABRICATION

BACKGROUND

For the past several decades, feature size reduction has been a key focus for industrial-scale semiconductor process development. Scaling to smaller dimensions enables a higher density of functional elements per chip, smaller chips, and also reduced cost. However, as the industry approaches the physical limits of traditional scaling, it is becoming increasingly important to look for non-traditional types of devices that can offer new functionality. One such example is non-volatile memory based on a perpendicular magnetic tunnel junction (MTJ).

Non-volatile embedded memory device with magnetic tunnel junction (MTJ), e.g., on-chip embedded memory with non-volatility can enable energy and computational efficiency. However, the technical challenges of assembling a MTJ stack to form functional devices present formidable roadblocks to commercialization of this technology today. Specifically, enhancing the perpendicular magnetic anisotropy in the fixed magnetic layers is one of the challenges in assembling a viable MTJ stack.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1G illustrates a cross-sectional view of individual layers of a synthetic antiferromagnetic structure, in accordance with an embodiment of the present disclosure.

FIG. 1H illustrates a cross-sectional view depicting the direction of magnetization in a free magnet relative to the direction of magnetization in a fixed magnetic layer, in accordance with an embodiment of the present disclosure.

FIG. 1I illustrates a cross-sectional view depicting the direction of magnetization in a free magnet relative to the direction of magnetization in a fixed magnetic layer, in accordance with an embodiment of the present disclosure.

DESCRIPTION OF THE EMBODIMENTS

Figure 1A:
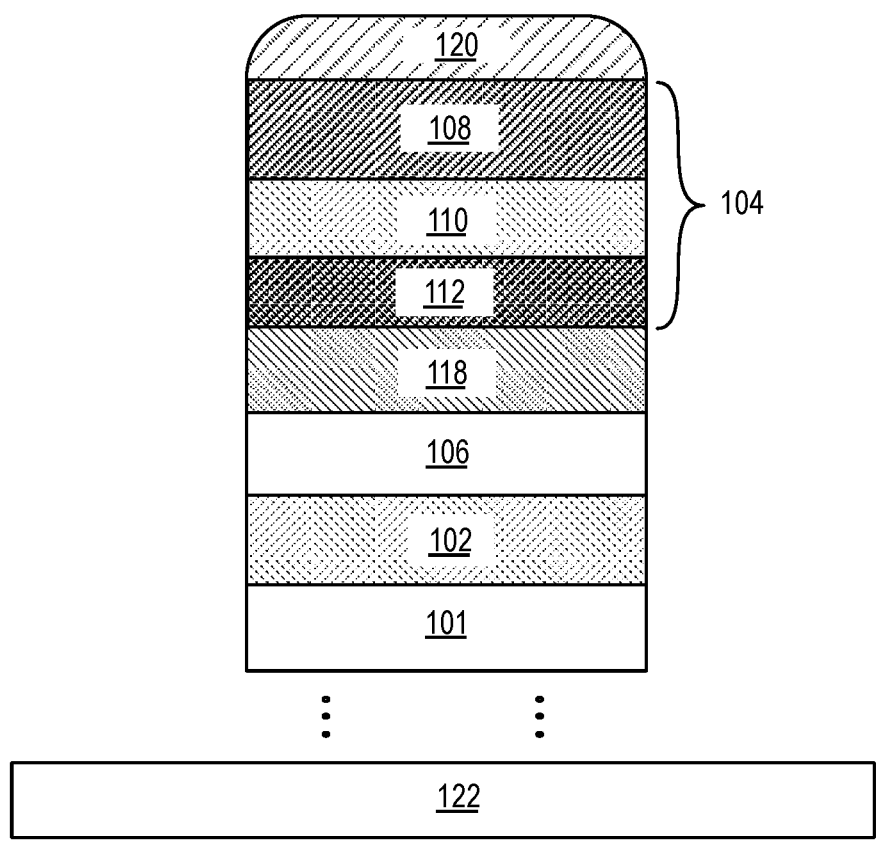
FIG. 1A illustrates a cross-sectional view of a memory device, in accordance with an embodiment of the present disclosure.

Perpendicular-MTJ (pMTJ) devices with enhanced perpendicular magnetic anisotropy in fixed magnetic layers and methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as transistor operations and switching operations associated with embedded memory, are described in lesser detail in order to not unnecessarily obscure embodiments of the present invention. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

An MTJ device functions as a memory device where the resistance of the MTJ device switches between a high resistance state and a low resistance state. The resistance state of an MTJ device is defined by the relative orientation of magnetization between a free magnet and a fixed magnet, that is separated from the free magnet by a tunnel barrier. When the magnetization of the free magnet and a fixed magnet have orientations that are in the same direction, the MTJ device is said to be in a low resistance state. Conversely, when the magnetization of the free magnet and the magnetization of the fixed magnet are oriented in opposite direction to each other, the MTJ device is said to be in a high resistance state.

As MTJ devices are scaled, the need for smaller memory elements to fit into a scaled cell size has driven the industry in the direction of perpendicular MTJ (pMTJ). pMTJ based memory devices have a fixed magnet and a free magnet each having a magnetic anisotropy that is perpendicular with respect to a horizontal plane of the free magnet. Resistance switching is brought about in a pMTJ device by passing a critical amount of spin polarized current through the pMTJ device so as to influence the orientation of the magnetization of the free magnet aligning it with, or against, the magnetization of the fixed magnet. The act of influencing the magnetization is brought about by a phenomenon known as spin torque transfer, where the torque from the spin polarized current (from fixed magnet) is imparted to the magnetization of the free magnet. By changing the direction of the current through the pMTJ, the direction of magnetization in the free magnet may be reversed relative to the direction of magnetization in the fixed magnet. Since the free magnet does not need a constant source of spin polarized current to maintain a magnetization direction, the resistance state of the pMTJ device is retained even when no current flows through the pMTJ device. For this reason, the pMTJ device belongs to a class of memory known as non-volatile memory.

Because a fixed magnet provides for a spin polarized current and remains in a fixed orientation there are challenges for selecting materials for the fixed magnet. Other challenges arise from maintaining and improving perpendicular magnetic anisotropy (PMA) in the fixed magnet to prevent un-intentional changes in magnetization. Improving magnetics (i.e., enhancing perpendicular magnetic anisotropy) in a fixed magnet of a pMTJ stack can improve process margins for bit yield, allow for a higher coercivity switching layer, and provide robustness against loss of switching efficiency from canting of magnetization in fixed magnetic layers and from thermal degradation. Enhancing the PMA of the fixed magnet may be accomplished by inserting additional layers of high-anisotropy multilayers and/or alloys between a bottom electrode and the fixed magnet. One example of a high-anisotropy multilayer stack is a synthetic antiferromagnetic (SAF) structure that includes alternating layers of magnetic and non-magnetic materials, where the SAF structure couples with a fixed magnet of a pMTJ stack. For practical utility it is advantageous for a SAF structure to magnetically couple with the fixed magnet but not magnetically influence a free magnet that is separated from the fixed magnet by a thin (approximately 1 nm-1.5 nm) tunnel barrier.

In various embodiments, a pMTJ device is above a bottom electrode that includes a material, having a cubic <001> crystal texture, for example TiN. Such a bottom electrode may offer ease in integrability of MTJ devices connected to peripheral devices such as transistors, for example. However, such a bottom electrode may present a surface that is incompatible for growth of layers in the SAF structure having a FCC<111> crystal texture. It may be advantageous to have an intermediate layer above the bottom electrode, that has a crystal texture which promotes high quality FCC <111> crystal texture in the SAF structure and subsequently in the fixed magnetic layer. An intermediate layer that promotes a high-quality FCC <111> crystal texture in fixed magnetic layer can enhance perpendicular magnetic anisotropy (PMA) of the fixed magnetic layer.

In accordance with embodiments of the present disclosure, a memory device includes a conductive layer such as an alloy including ruthenium and tungsten between a bottom electrode and a SAF structure. Such an alloy, rather than a layer of a single metal such as ruthenium or tungsten alone, may promote an advantageous crystal texture in a seed layer (lowermost layer of a SAF structure). For example, ruthenium has a HCP (0001) texture and the symmetry of the Ru (0001) plane may substantially match that of FCC (111) planes of a seed layer above but induce strain in the seed layer. A layer of platinum seed layer may have a strong FCC (111) texture growth above a layer of ruthenium, but there may be strain induced in the platinum seed layer. The magnetic anisotropy of the SAF structure may be sensitive to strain in the seed layer. Because there exists a lattice constant mismatch between pure ruthenium and a layer of platinum for example, it may be advantageous to further reduce the lattice constant mismatch to reduce strain. An alloy of ruthenium and tungsten may tune the lattice constant of the seed layer, reduce strain and improve PMA of the multilayer stack above and may therefore be advantageous as a starting surface for the formation of the one or more layers in a SAF structure.

FIG. 1A is an illustration of a cross-sectional view of a memory device 100 in accordance with an embodiment of the present disclosure. The memory device 100 includes a conductive layer 102 such as an alloy including ruthenium and tungsten between a bottom electrode 101 and a pMTJ 104. The pMTJ 104 includes a free magnet 108, a fixed magnet 112, and a tunnel barrier 110 between the free magnet 108 and the fixed magnet 112.

The chemical composition of the conductive layer may be different depending on the embodiment. In some embodiments, the conductive layer 102 includes between 5-70 percent of tungsten. In some such embodiments, the balance of the conductive layer is predominantly ruthenium. Examples of trace impurities such as C, Si and O may exist in the alloy, but concentrations may be well below 0.1%. In other embodiments, the conductive layer 102 is no more than 50% tungsten and the balance is substantially ruthenium. In one or more embodiments, the conductive layer 102 has a thickness between 0.5 nm and 10 nm.

Figure 1B:
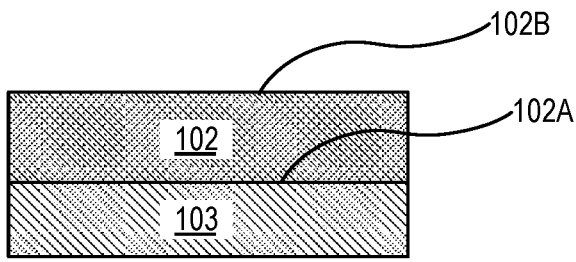
FIG. 1B illustrates a cross-sectional view of an alloy on a first conductive layer, in accordance with embodiments of the present disclosure.

In one example, the conductive layer 102 is on a second conductive layer 103, such as is illustrated in FIG. 1B. In such an example, the second conductive layer 103 may be predominantly tungsten. In some such examples, the second conductive layer 103 can have a thickness between 0.1 nm and 3 nm. In other embodiments, the first conductive layer 102 may have a graded concentration of tungsten, where the percent of tungsten decreases from a lower most surface 102A to an uppermost surface 102B. In some such embodiments the lower most portions of the first conductive layer 102 is between 35% and 40% tungsten.

Figure 1C:
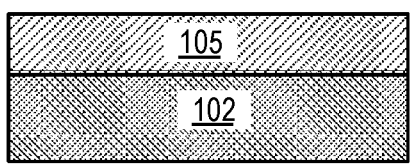
FIG. 1C illustrates a cross-sectional view of a second conductive layer on an alloy, in accordance with embodiments of the present disclosure.

In some examples, a fourth conductive layer 105 may be directly on the first conductive layer 102, as illustrated in FIG. 1C. In some such example, the fourth conductive layer 105 is ruthenium and the first conductive layer 102 has a composition that is no more than 50% tungsten and a balance that is substantially ruthenium. The fourth conductive layer 105 may have a thickness that is less than 2 nm.

Figure 1D:
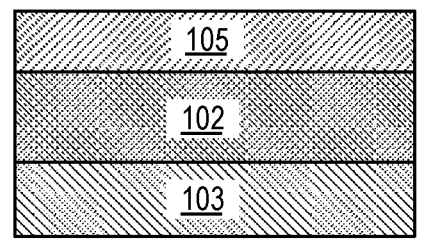
FIG. 1D illustrates a cross-sectional view of an alloy on a first conductive layer, and a second conductive layer on the alloy in accordance with embodiments of the present disclosure.

In other examples the fourth conductive layer 105 is directly on the first conductive layer 102, and the first conductive layer 102 is on the second conductive layer 103, as illustrated in FIG. 1D. In some such embodiment, the fourth conductive layer 105 including ruthenium is directly on the conductive layer 102, and the conductive layer 102 is on the second conductive layer 103 that is predominantly tungsten.

Figure 1E:
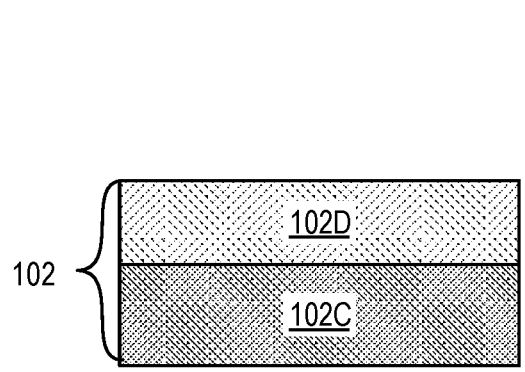
FIG. 1E illustrates a cross-sectional view of a first alloy on a second alloy.

In some embodiments, the conductive layer 102 may include a bilayer having a first conductive alloy 102C and a second conductive alloy 102D on the first conductive alloy 102C, such as is illustrated in FIG. 1E. In some such embodiments, the first conductive alloy 102C is predominantly tungsten and the second conductive alloy 102D includes predominantly ruthenium. In some such embodiments, the first conductive alloy 102C has a thickness between 0.05 nm and 2 nm and the second conductive alloy 102D has a thickness between 0.05 nm and 1.0 nm.

Figure 1F:
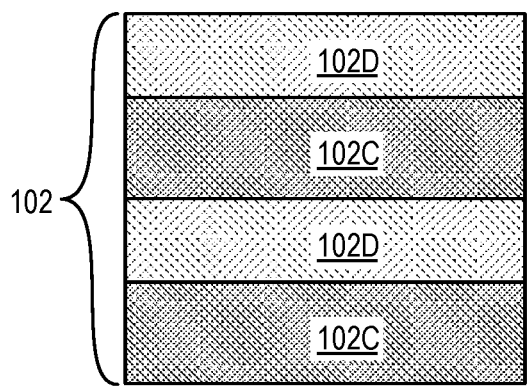
FIG. 1F illustrates a cross-sectional view of a plurality of bilayers of the first alloy on the second alloy.

In other embodiments, the conductive layer 102 includes a plurality of bilayers where each bilayer includes the first conductive alloy 102C and the second conductive alloy 102D on the first conductive alloy 102C, such as is illustrated in FIG. 1F. In some such embodiments, the number of bilayers can range from 2-10.

Referring once again to FIG. 1A, in an embodiment, the memory device 100 further includes a seed layer 106 above the conductive layer 102. The seed layer 106, may set a crystalline template for the subsequent magnetic layers above during the formation process. In an embodiment, the seed layer 106 has a FCC <111> crystal texture. An example seed layer 106, that may be applicable for a Co/Pt multilayer above the seed layer 106, includes a metal such as platinum. In one such embodiment, the platinum seed layer 106 has a FCC <111> crystal texture. When the seed layer 106 includes Pt, the Pt seed layer 106 has a thickness in the range of 0.2 nm-5 nm.

In an embodiment, the memory device 100 further includes a synthetic antiferromagnetic structure 118 above the seed layer 106.

FIG. 1G illustrates cross-sectional view of the SAF structure 118 in an accordance of an embodiment of the present disclosure. In an embodiment, the SAF structure 118 includes a non-magnetic layer 118B sandwiched between a first pinning ferromagnet 118A and a second pinning ferromagnet 118C as depicted in FIG. 1G. The first pinning ferromagnet 118A and the second pinning ferromagnet 118C are anti-ferromagnetically coupled to each other.

The pinning ferromagnets 118A and 118C may be designed to have high coercive fields and a high degree of perpendicular magnetic anisotropy. In an embodiment, the first pinning ferromagnet 118A includes a layer of a magnetic metal such as Co, Ni, Fe, or alloys of magnetic metals such as Co, Ni, Fe, alloys such as, but not limited to Co—W or Co—Mo, Co—Pt, Co—Pd or Fe—Pt. In other embodiments the first pinning ferromagnet 118A includes one or more bilayers having a layer of non-magnetic metal on a layer of magnetic metal such as, but not limited to, Co/Pd, Co/Pt, Co/Ni, Co/W or Co/Mo. In an embodiment, each layer of magnetic material has a thickness between 0.2 nm and 0.8 nm, and each layer of non-magnetic material has at thickness between 0.2 nm and 0.8 nm. The number of bilayers may range between 1-12.

In an embodiment, the second pinning ferromagnet 118C includes a layer of a magnetic metal such as Co, Ni, Fe, or alloys of magnetic metals such as Co, Ni, Fe, alloys such as, but not limited to Co—W or Co—Mo, Co—Pt, Co—Pd or Fe—Pt. In other embodiments the first pinning ferromagnet 118A includes one or more bilayers having a layer of non-magnetic metal on a layer of magnetic metal such as, but not limited to, Co/Pd, Co/Pt, Co/Ni, Co/W or Co/Mo. In an embodiment, each layer of magnetic material has a thickness between 0.2 nm and 0.8 nm, and each layer of non-magnetic material has at thickness between 0.2 nm and 0.8 nm. The number of bilayers may range between 1-12.

The first pinning ferromagnet 118A and the second pinning ferromagnet 118C may each include the same combination of metals/alloy or one or more bilayers, where the thicknesses of each ferromagnet 118A or 118C may be the same or different. In other examples, the first pinning ferromagnet 118A and the second pinning ferromagnet 118C may each include a different combination of metals/alloy or one or more bilayers, where the thicknesses of each ferromagnet 118A or 118C may be the same or different.

In an embodiment, the non-magnetic layer 118B includes a ruthenium or an iridium layer. In an embodiment, non-magnetic layer 118B includes ruthenium and has a thickness between 0.3 nm and 1.0 nm to provide coupling between the first pinning ferromagnet 118A and the second pinning ferromagnet 118C that is anti-ferromagnetic in nature.

It is to be appreciated that an additional layer of non-magnetic spacer (not shown in FIG. 1A) may exist between the SAF structure 118 and the fixed magnet 112.

In an embodiment, the fixed magnet 112 includes magnetic materials with sufficient perpendicular magnetization. In an embodiment, the fixed magnet 112 of the pMTJ 104 can include alloys such as CoFe, CoFeB, FeB. The alloys of CoFe, CoFeB, FeB may include doping with one or more of Ta, Hf, W, Mo, Ir, Ru, Si or C, to promote high perpendicular anisotropy. Alternatively, the alloys of CoFe, CoFeB, FeB may include thin layers of W, Ta or Mo to promote high perpendicular anisotropy. In an embodiment, the fixed magnet 112 comprises a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the fixed magnet 112 is FeB, where the concentration of boron is between 10-40 atomic percent of the total composition of the FeB alloy.

In an embodiment, tunnel barrier 110 includes a material suitable for allowing electron current having a majority spin to pass through tunnel barrier 110, while impeding, at least to some extent, electron current having a minority spin from passing through tunnel barrier 110. Thus, tunnel barrier 110 (or spin filter layer) may also be referred to as a tunneling layer for electron current of a particular spin orientation. In an embodiment, the tunnel barrier 110 includes a material such as, but not limited to, oxygen and at least one of magnesium (e.g., a magnesium oxide, or MgO), or aluminum (e.g., an aluminum oxide such as $Al_2O_3$). In the illustrative embodiment, the tunnel barrier 110 including MgO has a crystal orientation that is (001) and is lattice matched to fixed magnet 112 below the tunnel barrier 110 and free magnet 108 above tunnel barrier 110. In an embodiment, a free magnet 108 including a $Co_{100-x-y}Fe_xB_y$, is highly lattice matched to the tunnel barrier 110 including an MgO. Lattice matching a crystal structure of the free magnet 108 with the tunnel barrier 110 enables a higher tunneling magnetoresistance (TMR) ratio in the pMTJ 104. In an embodiment, tunnel barrier 110 is MgO and has a thickness in the range between 1 nm to 2 nm.

In an embodiment, the free magnet 108 includes a magnetic material such as Co, Ni, Fe or alloys of these materials. In an embodiment, the free magnet 108 includes a magnetic material such as CoB, FeB, CoFe and CoFeB. In an embodiment, the free magnet 108 include alloys such as CoFe, CoFeB, FeB, that include doping with one or more of tungsten, tantalum, or molybdenum to promote high perpendicular anisotropy, or including thin layers of W, Ta or Molybdenum to promote high perpendicular anisotropy.

FIG. 1H illustrates a cross-sectional view depicting the free magnet 108 of the pMTJ 104 having a direction of magnetization (denoted by the direction of the arrow 154) that is anti-parallel to a direction of magnetization (denoted by the direction of the arrow 156) in the fixed magnet 112. When the direction of magnetization 154 in the free magnet 108 is opposite (anti-parallel) to the direction of magnetization 156 in the fixed magnet 112, the pMTJ 104 device is said to be in a high resistance state.

Conversely, FIG. 1I illustrates a cross-sectional view depicting the free magnet 108 of the pMTJ 104 having a direction of magnetization (denoted by the direction of the arrow 154) that is parallel to a direction of magnetization (denoted by the direction of the arrow 156) in the fixed magnet 112. When the direction of magnetization 154 in the free magnet 108 is parallel to the direction of magnetization 156 in the fixed magnet 112, the pMTJ 104 is said to be in a low resistance state.

In an embodiment, the free magnet 108 and the fixed magnet 112 can have approximately similar thicknesses and an injected spin polarized current which changes the direction of the magnetization 154 in the free magnet 108 can also affect the magnetization 156 of the fixed magnet 112. In an embodiment, the fixed magnet 112 has a higher perpendicular magnetic anisotropy than the free magnet 108 and is more resistant to accidental magnetization flipping. In another embodiment, the fixed magnet 112 has a magnetization that is pinned by a strong PMA of the synthetic antiferromagnetic (SAF) structure such as the SAF structure 118 (not illustrated) below the fixed magnet 112. Such pinning may prevent an accidental change in the direction of magnetization 156 in the fixed magnet 112.

Referring again to FIG. 1A, the memory device 100 further includes a top electrode 120. In an embodiment, the top electrode 120 includes a material such as Ta or TiN. In an embodiment, the electrode 120 has a thickness between 5 nm and 70 nm. In some embodiments, the electrode 101 includes one or more layers including materials such as but not limited to TaN, W, Ru or TiN. In some embodiments, other layers including an oxide and a thin metallic cap layer on the oxide may be included between the free magnet 108 and the top electrode 120 to increase perpendicular magnetic anisotropy.

In an embodiment, the substrate 122 includes a suitable semiconductor material such as but not limited to, single crystal silicon, polycrystalline silicon and silicon on insulator (SOI). In another embodiment, substrate 122 includes other semiconductor materials such as germanium, silicon germanium or a suitable group III-N or a group III-V compound. Logic devices such as MOSFET transistors and access transistors and may be formed on the substrate 122. Logic devices such as access transistors may be integrated with memory devices such as memory device 100 to form embedded memory. Embedded memory including memory devices 100 and logic MOSFET transistors can be combined to form functional integrated circuit such as a system on chip.

Figure 2:
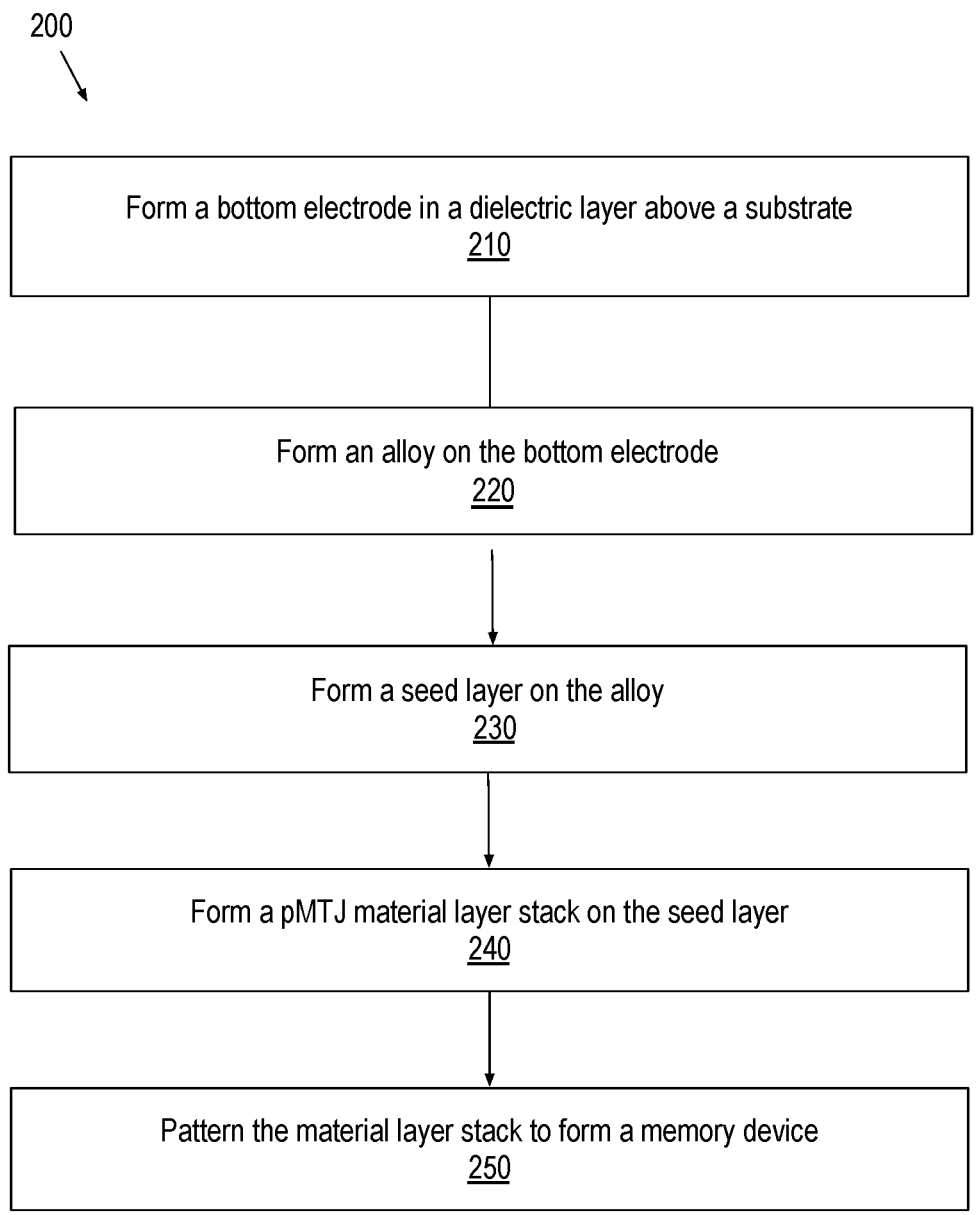
FIG. 2 illustrates a flow diagram of a method to fabricate a memory device.

FIG. 2 illustrates a flow diagram of a method to fabricate a memory device such as the memory device 100. The method 200 begins at operation 210 by forming a bottom electrode above a conductive interconnect formed in a dielectric layer a substrate. The method continues at operation 220 with the formation of an alloy of tungsten and ruthenium on the bottom electrode. The method 200 continues at operation 230 with the formation of a seed layer having a FCC <111> crystal texture on the alloy of tungsten and ruthenium. The method 200 continues at operation 240 with the formation of a pinning magnetic layer having a FCC <111> crystal texture on the seed layer and formation of remaining layers of a pMTJ material layer stack. At operation 250, the method 200 involves patterning the material layer stack to form a memory device.

FIGS. 3A-3F illustrate cross-sectional views representing various operations in a method of fabricating a memory device, such as the memory device 100 in accordance with embodiments of the present disclosure.

Figure 3A:
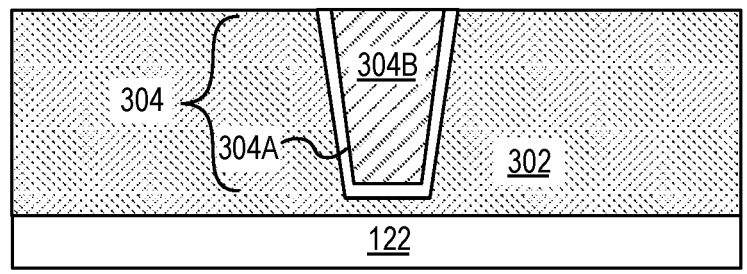
FIG. 3A illustrates a conductive interconnect formed above a substrate.

FIG. 3A illustrates a conductive interconnect 304 formed above a substrate 150. In some embodiments, the conductive interconnect 304 is formed in a dielectric layer 302, above a substrate, such as is shown. In an embodiment, the conductive interconnects 304 includes a barrier layer 304A and a fill metal 304B. In some examples, the barrier layer 304A includes a material such as tantalum nitride or ruthenium. In some examples, the fill metal 304B includes a material such as cobalt, copper or tungsten. In other examples, the conductive interconnect 304 is fabricated using a subtractive etch process when materials other than copper are utilized. In an embodiment, the dielectric layer 302 includes a material such as but not limited to silicon dioxide, silicon nitride, silicon carbide, or carbon doped silicon oxide. The dielectric layer 302 may have an uppermost surface that is substantially co-planar with an uppermost surface of the conductive interconnect 304, as is illustrated. In some embodiments, conductive interconnects 304 is electrically connected to a separate circuit element such as a transistor (not shown).

Figure 3B:
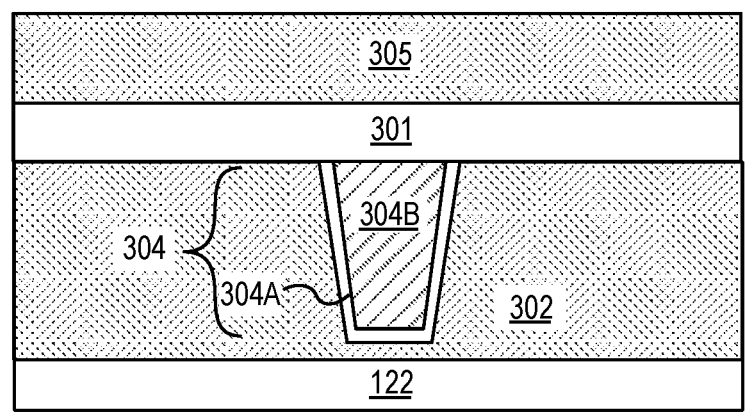
FIG. 3B illustrates the structure of FIG. 3A following the formation of an alloy layer.

FIG. 3B illustrates the structure of FIG. 3A following the formation of a conductive layer 301 on the conductive interconnect 304 and over the dielectric layer 302. In an embodiment, the conductive layer 301 includes a material that is the same or substantially the same as the material of the bottom electrode 120.

An alloy layer 305 including ruthenium and tungsten is formed on the conductive layer 301. In an embodiment, the alloy layer 305 is formed by reactively co-sputtering tungsten and ruthenium onto the conductive layer 301. Depending on the material composition desired, the atomic percent of tungsten and ruthenium can be controlled during the deposition process. The atomic percent of tungsten and ruthenium can be varied during the deposition process to create an alloy having a gradient in the constituents of the alloy.

In a second embodiment, an alloy layer 305 is formed by a deposition process where a thin layer of Ru is deposited onto a thin layer of tungsten, and where the deposition process is continued until a plurality of alternating layers of W and Ru are formed. The resulting material layer stack can be annealed to diffuse and intermix the W and the Ru forming the alloy layer 305. In some such embodiments, the layer of tungsten is between 0.05 nm and 1 nm, and the layer of ruthenium is between 0.05 nm and 1 nm.

In a third embodiment, an alloy layer 305 is formed by sputtering an alloyed material from a Ru—W alloy target. In an embodiment, each Ru—W alloy target may have a particular relative atomic percent of W and Ru. In some embodiments, multiple Ru—W alloy targets each with different relative atomic percent of W and Ru may be utilized to deposit a plurality of alloy layers, such as alloy layer 102C and 102D, depicted in FIGS. 1E and 1F.

In one or more embodiments, deposition of the alloy layer 305 may begin by first depositing a layer of predominantly tungsten and then forming an alloy layer 305 on the layer of predominantly tungsten. In some such embodiments, the deposition process further includes depositing a layer of ruthenium on the alloy layer 305, where the ruthenium has a thickness less than 0.5 nm.

In or more of the embodiments, the alloy layer 305 has a thickness between 0.5 nm and 10 nm.

Figure 3C:
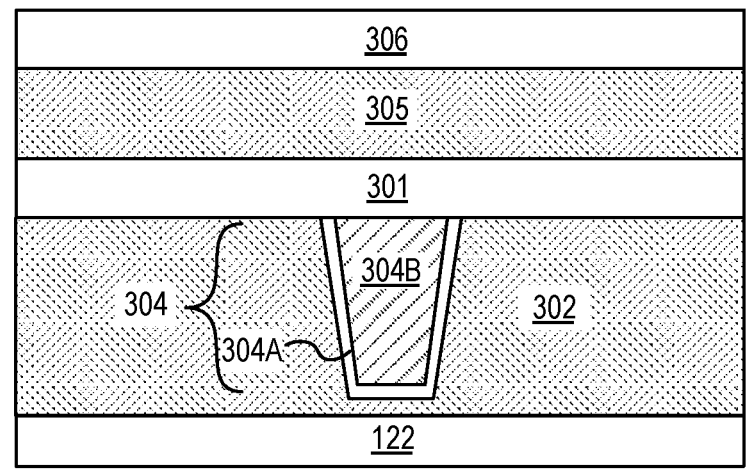
FIG. 3C illustrates the structure of FIG. 3B following the formation of a seed layer on the alloy layer

FIG. 3C illustrates the structure of FIG. 3B following the formation a seed layer 306 on the alloy layer 305. In an embodiment, as discussed above, the alloying of W and Ru changes the crystallographic texture of the alloy layer 305, compared to a layer of predominantly Ru or predominantly W. The crystallographic texture of the alloy layer 305 may enable a seed layer to be grown with a FCC <111> crystal texture with reduced strain mismatch compared to when a seed layer is grown on an underlying layer that does not include an alloy of tungsten and ruthenium. In an embodiment, the seed layer includes platinum having a FCC <111> crystal orientation. In other embodiments, the seed layer includes, Pd, W, or Mo. The seed layer may be deposited to a thickness between 0.2 nm-1 nm.

Figure 3D:
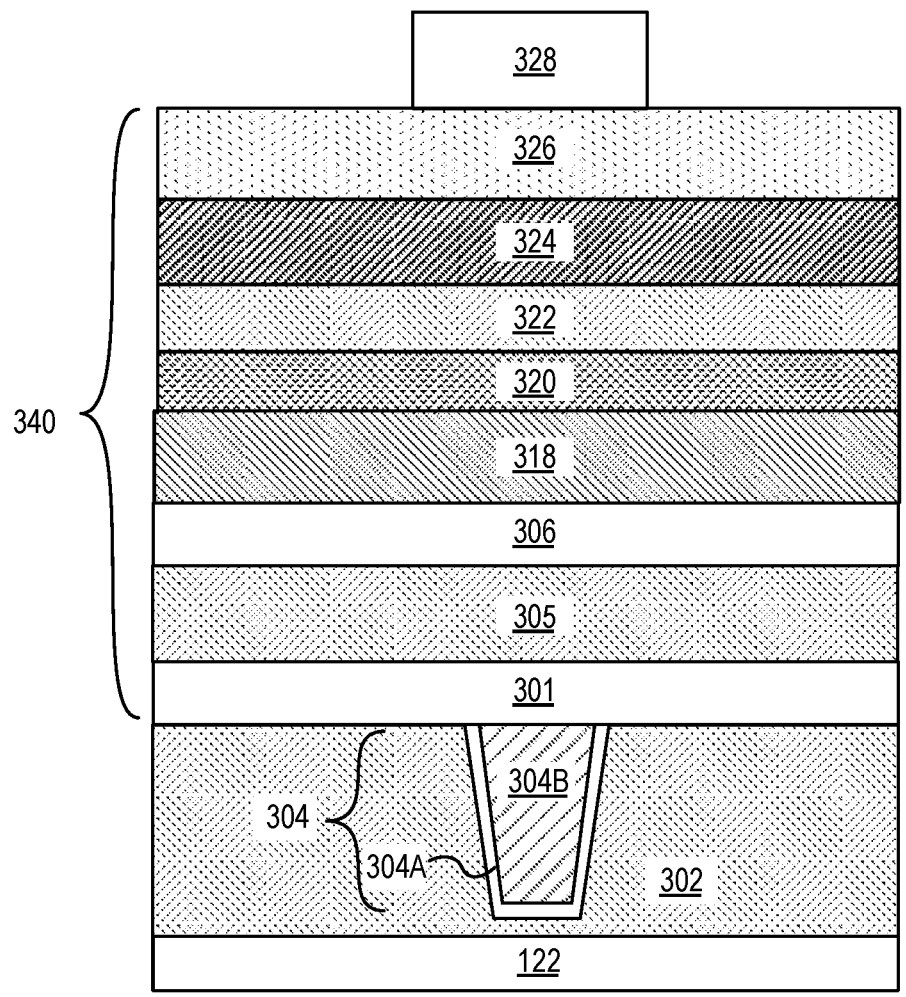
FIG. 3D illustrates a cross-sectional view of the structure in FIG. 3C following the formation of a pMTJ material layer stack.

FIG. 3D illustrates a cross-sectional view of the structure in FIG. 3C following the formation of all layers in a pMTJ material layer stack 340. In an embodiment, one or more SAF layers 318 that form a SAF structure are formed on the seed layer 306. In some embodiments, one or more SAF layers 318 are blanket deposited on the seed layer 306 using a PVD process. In some embodiments, the one or more SAF layers 318 are the same or substantially the same as the one or more layers in the SAF structure 118, described above. In an embodiment, the seed layer 306 including a FCC <111> crystal texture enables a lattice matching with the lowermost layers of the one or more SAF layers 318. Such lattice matching enables the formation of fixed magnetic layer with strong perpendicular magnetic anisotropy above the one or more SAF layers 318. Furthermore, a seed layer 306 grown with reduced strain mismatch enables the lowermost SAF layers to be grown with an increased perpendicular anisotropy as measured by an increase in thermal stability.

The deposition process continues with formation of the pMTJ material layer stack 340 on the one or more SAF layers 318. In an embodiment, a fixed magnetic layer 320 is deposited first. The fixed magnetic layer 320 may be deposited using a PVD process or a plasma enhanced chemical vapor deposition process. In an embodiment, the fixed magnetic layer 320 includes a material that is the same or substantially the same as the material of the fixed magnet 112. In an embodiment, the deposition process forms a fixed magnetic layer 320 including CoFeB that is amorphous. In one example, fixed magnetic layer 320 is deposited to a thickness between 0.9 nm and 2.0 nm to fabricate a pMTJ. During an in-situ deposition process, a tunnel barrier layer 322 is then formed on the fixed magnetic layer 320, a free magnetic layer 324 is formed on the tunnel barrier layer 322 to complete formation of a material layer stack 360 for a MTJ.

In some embodiments, a tunnel barrier layer 322 is blanket deposited on the fixed magnetic layer 320. In an embodiment, the tunnel barrier layer 322 is a material including magnesium and oxygen or a material including aluminum and oxygen. In an exemplary embodiment, the tunnel barrier layer 322 is a layer of MgO and is deposited using a reactive sputter process. In an embodiment, the reactive sputter process is carried out at room temperature. In another embodiment, the reactive sputter process is carried out at a temperature between 25-350 degrees Celsius. In an embodiment, the tunnel barrier layer 322 is deposited to a thickness between 0.8 nm to 1 nm. In some examples, the deposition process is carried out in a manner that yields a tunnel barrier layer 322 having an amorphous structure. In some such examples, the amorphous tunnel barrier layer 322 becomes crystalline after performing a high temperature anneal process to be described further below. In other embodiments, the tunnel barrier layer 322 is crystalline as deposited.

In an embodiment, a free magnetic layer 324 is blanket deposited on an uppermost surface of the tunnel barrier layer 322. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the free magnetic layer 324 is $Co_{100-x-y}Fe_xB_y$, where X and Y each represent atomic percent, further where X is between 50-80 and Y is between 10-40, and further where the sum of X and Y is less than 100. In some embodiments, the free magnetic layer 324 includes a material that is the same or substantially the same as the material of the fixed magnet 116 described above. In some examples, the free magnetic layer 324 may be deposited to a thickness between 0.9 nm and 2.0 nm. A thickness range between 0.9 nm and 2.0 nm may be sufficiently thin to provide perpendicular magnetic anisotropy required to fabricate a perpendicular MTJ.

In an embodiment, a conductive layer 326 is blanket deposited on the surface of the free magnetic layer 324. In an embodiment, the conductive layer 326 includes a material suitable to provide a hardmask for etching the pMTJ material layer stack 340. In an embodiment, the conductive layer 326 includes one or more layers of material such as Ta, TaN or TiN. In an embodiment, the thickness of the conductive layer 326 ranges from 30 nm-70 nm. A thickness in the range between 30 nm and 70 nm is chosen to provide aspect ratio (total height to width of pMTJ device) between 1:1 to 5:1 while etching the pMTJ material layer stack to form pMTJ devices.

In other embodiments, depositing the free magnetic layer includes depositing a plurality of free magnetic layers that are separated by a nonmagnetic coupling layer in between, to form a free magnet structure, such as is described above. Such a free magnet structure may be further capped by a conductive oxide such as a layer of MgO, or $Al_2O_3$ which helps to increase interfacial perpendicular magnetic anisotropy. In yet a different embodiment, the conductive oxide may be further capped by conductive layers protect the conductive oxide during a patterning process to form a MTJ device.

In an embodiment, after all the layers in the pMTJ material layer stack 340 are deposited, an anneal is performed. In an embodiment, the anneal process enables formation of a crystalline alloy of one or more of Co, Fe or B in the fixed magnetic layer 320 and/or free magnetic layer 324. In an embodiment, the anneal is performed immediately post deposition but before forming the mask 328 on the conductive layer 326. A post-deposition anneal of the pMTJ material layer stack 340 is carried out in a furnace at a temperature between 300-400 degrees Celsius in a vacuum environment. In an embodiment, the forming gas includes a mixture of $H_2$ and $N_2$ gas. In an embodiment, the annealing process promotes solid phase epitaxy of the fixed magnetic layer 320 to follow a crystalline template of the tunnel barrier layer 310 (e.g., MgO) that is directly above the fixed magnetic layer 320. In an embodiment, the anneal also promotes solid phase epitaxy of the free magnetic layers 313 to follow a crystalline template of the tunnel barrier layer 310 (e.g., MgO) that is directly below the free magnetic layer 313, in the illustrative embodiment. <001> Lattice matching between the tunnel barrier layer 322 and the fixed magnetic layer 320 and <001> lattice matching between the tunnel barrier layer 322 and the free magnetic layer 309 enables a TMR ratio of at least 90% to be obtained in the pMTJ material layer stack 340.

In an embodiment, the mask 328 defines a shape and size of a memory device and a location where the memory device is to be subsequently formed with respect the conductive interconnect 304. In some embodiments, the mask 328 is formed by a lithographic process. In other embodiments, the mask 328 includes a dielectric material that has been patterned.

Figure 3E:
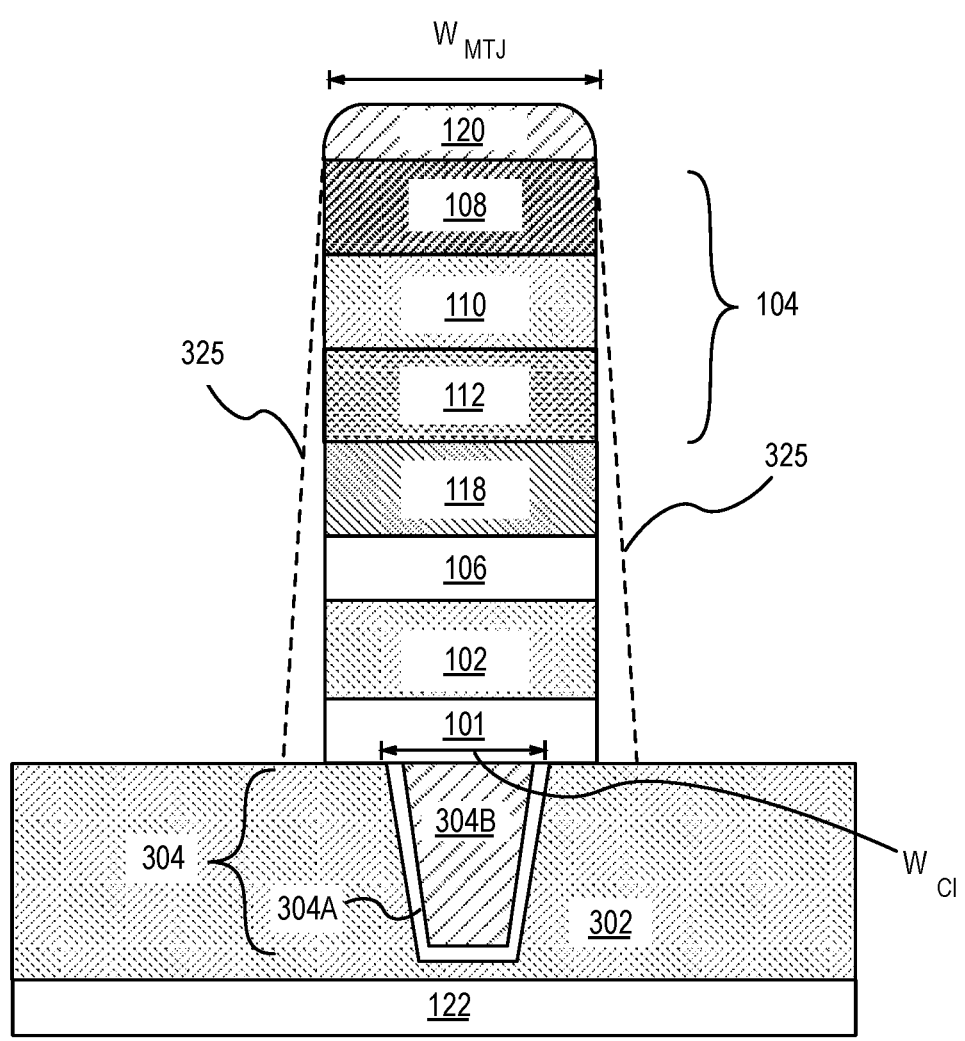
FIG. 3E illustrates a cross-sectional view of the structure in FIG. 3D following the patterning of the pMTJ material layer stack to form a memory device.

FIG. 3E illustrates a cross-sectional view of the structure in FIG. 3D following the patterning of the pMTJ material layer stack 340. In an embodiment, the patterning process includes etching the conductive layer 326 by a plasma etch process to form a top electrode 120.

In an embodiment, the plasma etch process is then continued to pattern the layers of the pMTJ material layer stack 340 to form a pMTJ 104. The plasma etch process etches the various layers in the pMTJ material layer stack 340 to form a free magnet 108, the tunnel barrier 110 and the fixed magnet 112, SAF structure 118, seed layer 106, conductive layer 102 and bottom electrode 101.

In an embodiment, the memory device has a width, WMTJ, that is greater than a width $W_{CI}$ of the conductive interconnect 304, as shown. In one such embodiment, the plasma etch process exposes the underlying dielectric layer 302, when the memory device 100 is formed.

In an embodiment, where the memory device has a width, $W_{MTJ}$, that is less than a width $W_{CI}$ of the conductive interconnect 304, the plasma etch process exposes the underlying conductive interconnect. In such an embodiment, the etch would be stopped after the conductive layer 301 (FIG. 3D) is exposed. The formation of the bottom electrode may take place at a later operation with additional formation of dielectric layers and masking operations.

In some embodiments, depending on the etch parameters, the memory device 100 may have sidewalls that are tapered as indicated by the dashed lines 325. The memory device 100 formed over the bottom electrode 101, constitutes a memory device with a perpendicular magnetic tunnel junction 104.

Figure 3F:
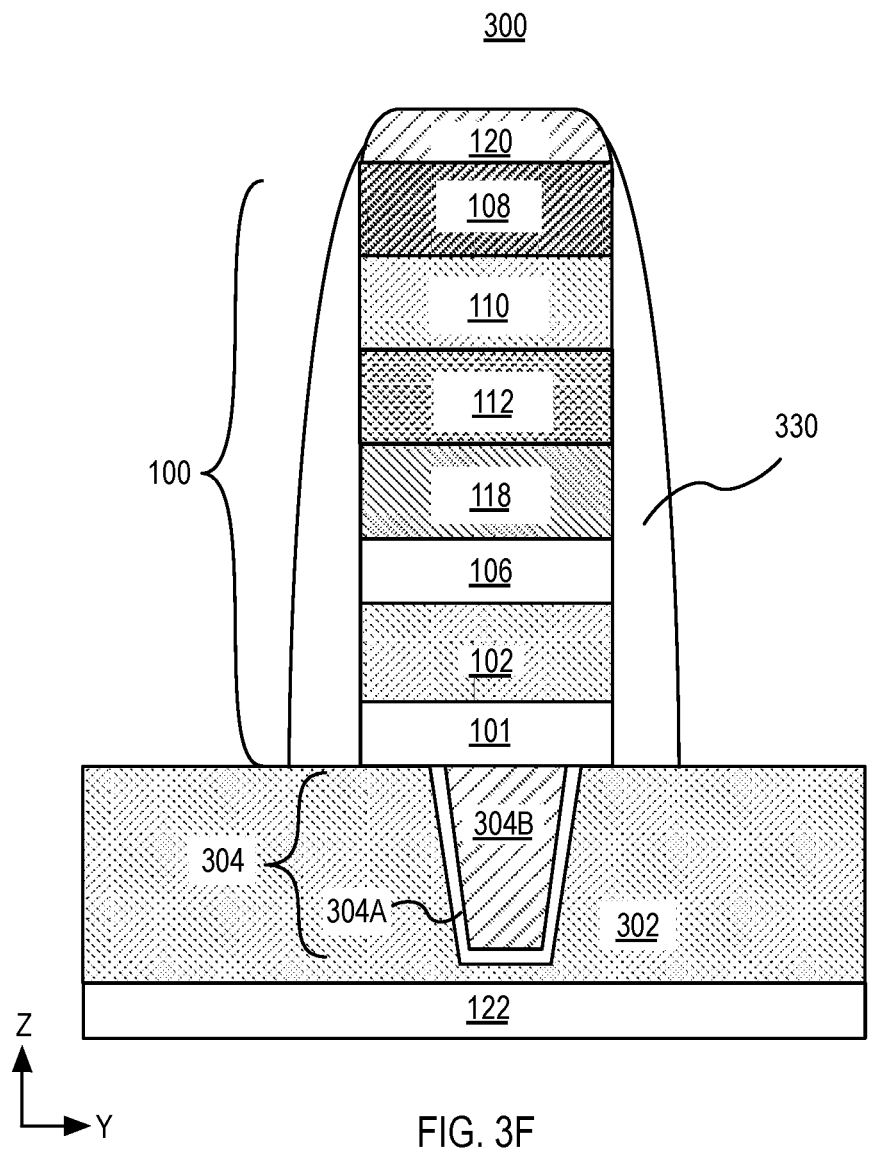
FIG. 3F illustrates a cross-sectional view of the structure in FIG. 5C following the formation of a dielectric spacer adjacent to the memory device.

FIG. 3F illustrates a cross-sectional view of the structure in FIG. 3E following the formation of a dielectric spacer 330 adjacent to the memory device 100. In an embodiment, a dielectric spacer layer is deposited on the memory device 100 and on the uppermost surface of the dielectric layer 140. In an embodiment, the dielectric spacer layer is deposited without a vacuum break following the plasma etch process to prevent oxidation of magnetic layers in the pMTJ 104. In an embodiment, the dielectric spacer layer includes a material such as, but not limited to, silicon nitride, carbon doped silicon nitride or silicon carbide. In an embodiment, the dielectric spacer layer includes an insulator layer that does not have an oxygen to minimize potential deliberate oxidation of magnetic layers. In an embodiment, the dielectric spacer layer is etched by a plasma etch process forming dielectric spacer 330 on sidewalls of the memory device 100. The structure of FIG. 3F including the dielectric spacer 330 on sidewalls of the memory device 100 is herein referred to as memory device 300.

Figure 4:
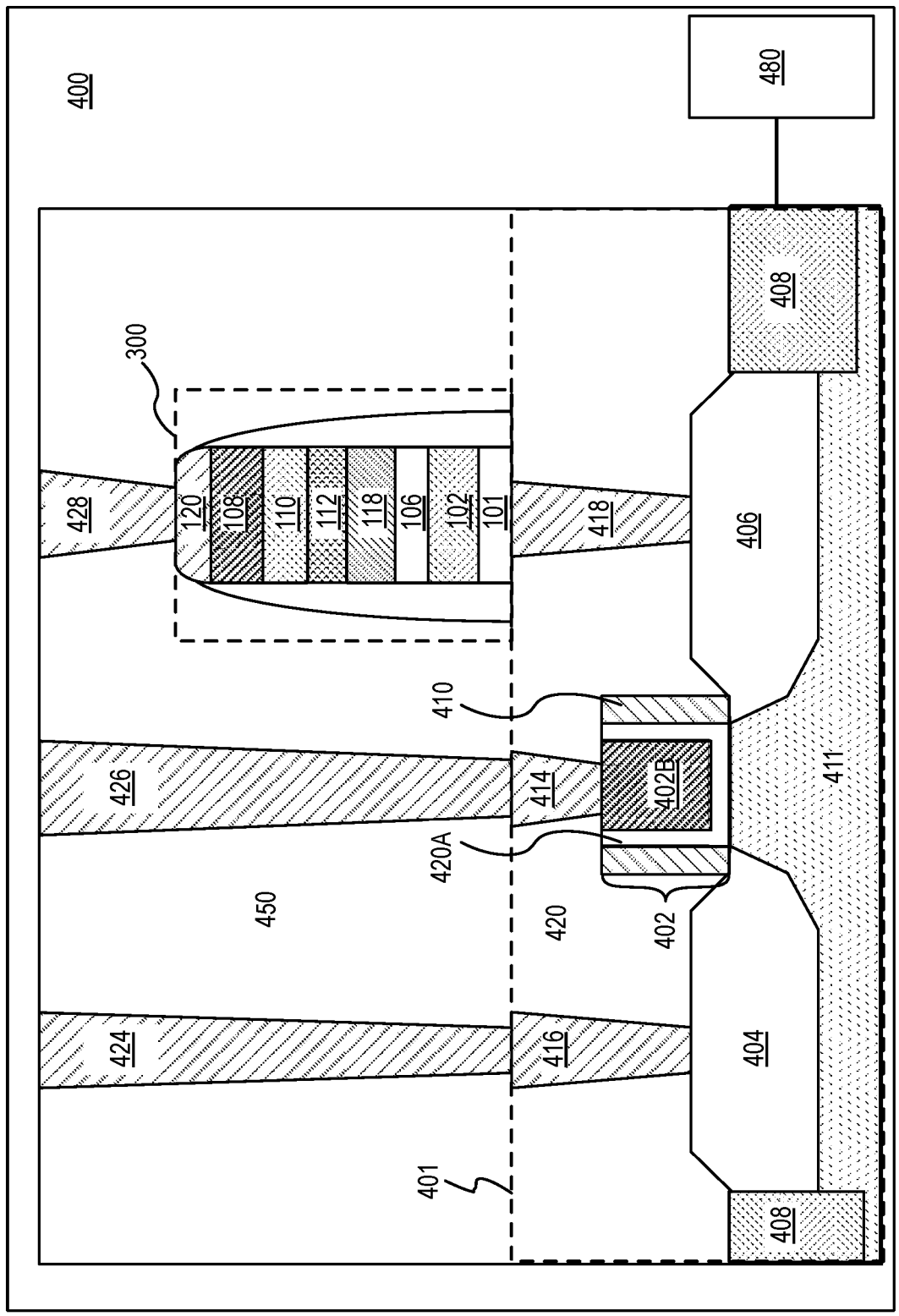
FIG. 4 illustrates a cross-sectional view of a memory device coupled to a transistor.

FIG. 4 illustrates a system 400 including a power supply 480 connected to a memory device 300 coupled with a transistor 401.

In an embodiment, the transistor 401 has a source region 404, a drain region 406 and a gate 402. The transistor 401 further includes a gate contact 414 above and electrically coupled to the gate 402, a source contact 416 above and electrically coupled to the source region 404, and a drain contact 418 above and electrically coupled to the drain region 406 as is illustrated in FIG. 4. The memory device 300 includes a conductive layer 102 including an alloy of ruthenium and tungsten between a bottom electrode 101 and a MTJ stack 104. The MTJ stack 104 includes a free magnet 108, a fixed magnet 112, and a tunnel barrier 110 between the free magnet 108 and the fixed magnet 112. In the illustrative embodiment, the memory device 300 further includes a seed layer 106 above the electrode 101 and a synthetic antiferromagnetic structure 118 between the seed layer 106 and the fixed magnet 112 and a top electrode above the free magnet 108. An MTJ contact 428 is coupled with the top electrode 120.

In an embodiment, the underlying substrate 411 represents a surface used to manufacture integrated circuits. Suitable substrate 411 includes a material such as single crystal silicon, polycrystalline silicon and silicon on insulator (SOI), as well as substrates formed of other semiconductor materials. In some embodiments, the substrate 411 is the same as or substantially the same as the substrate 126. The substrate 411 may also include semiconductor materials, metals, dielectrics, dopants, and other materials commonly found in semiconductor substrates.

In an embodiment, the transistor 401 associated with substrate 411 are metal-oxide-semiconductor field-effect transistors (MOSFET or simply MOS transistors), fabricated on the substrate 411. In various implementations of the invention, the access transistor 401 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the transistor 401 of substrate 411 includes a gate 402. In some embodiments, gate 402 includes at least two layers, a gate dielectric layer 402A and a gate electrode 402B. The gate dielectric layer 402A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 402A to improve its quality when a high-k material is used.

The gate electrode 402B of the transistor 401 of substrate 411 is formed on the gate dielectric layer 402A and may consist of at least one P-type work function metal or N-type work function metal, depending on whether the transistor is to be a PMOS or an NMOS transistor. In some implementations, the gate electrode 402B may consist of a stack of two or more metal layers, where one or more metal layers are work function metal layers and at least one metal layer is a conductive fill layer.

For a PMOS transistor, metals that may be used for the gate electrode 402B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.4 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.4 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 402B may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 402B may consist of one or more U-shaped metal layers formed atop one or more planar, non-U-shaped layers.

In some implementations of the invention, a pair of sidewall spacers 410 are on opposing sides of the gate 402 that bracket the gate stack. The sidewall spacers 410 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As is well known in the art, source region 404 and drain region 406 are formed within the substrate adjacent to the gate stack of each MOS transistor. The source region 404 and drain region 406 are generally formed using either an implantation/diffusion process or an etching/deposition process. In the former process, dopants such as boron, aluminum, antimony, phosphorous, or arsenic may be ion-implanted into the substrate to form the source region 404 and drain region 406. An annealing process that activates the dopants and causes them to diffuse further into the substrate typically follows the ion implantation process. In the latter process, the substrate 411 may first be etched to form recesses at the locations of the source and drain regions. An epitaxial deposition process may then be carried out to fill the recesses with material that is used to fabricate the source region 404 and drain region 406. In some implementations, the source region 404 and drain region 406 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 404 and drain region 406 may be formed using one or more alternate semiconductor materials such as germanium or a group III-V material or alloy. And in further embodiments, one or more layers of metal and/or metal alloys may be used to form the source region 404 and drain region 406. In the illustrative embodiment, an isolation 408 is adjacent to the source region 404, drain region 406 and portions of the substrate 411.

In an embodiment, a dielectric layer 420 is adjacent to the source contact 416, the drain contact 418 and the gate contact 414. In the illustrative embodiment, a source metallization structure 424 is coupled with the source contact 416 and a gate metallization structure 426 is coupled with the gate contact 414. In the illustrated embodiment, a dielectric layer 450 is adjacent to the gate metallization structure 426, source metallization structure 424, memory device 300 and MTJ contact 428.

In an embodiment, the source contact 416, the drain contact 418 and gate contact 414 each include a multi-layer stack. In an embodiment, the multi-layer stack includes two or more distinct layers of metal such as a layer of Ti, Ru or Al and a conductive cap on the layer of metal. The conductive cap may include a material such as, Co, W or Cu.

The isolation 408 and dielectric layers 420 and 450 may include any material that has sufficient dielectric strength to provide electrical isolation such as, but not, limited silicon dioxide, silicon nitride, silicon oxynitride, carbon doped nitride and carbon doped oxide.

Figure 5:
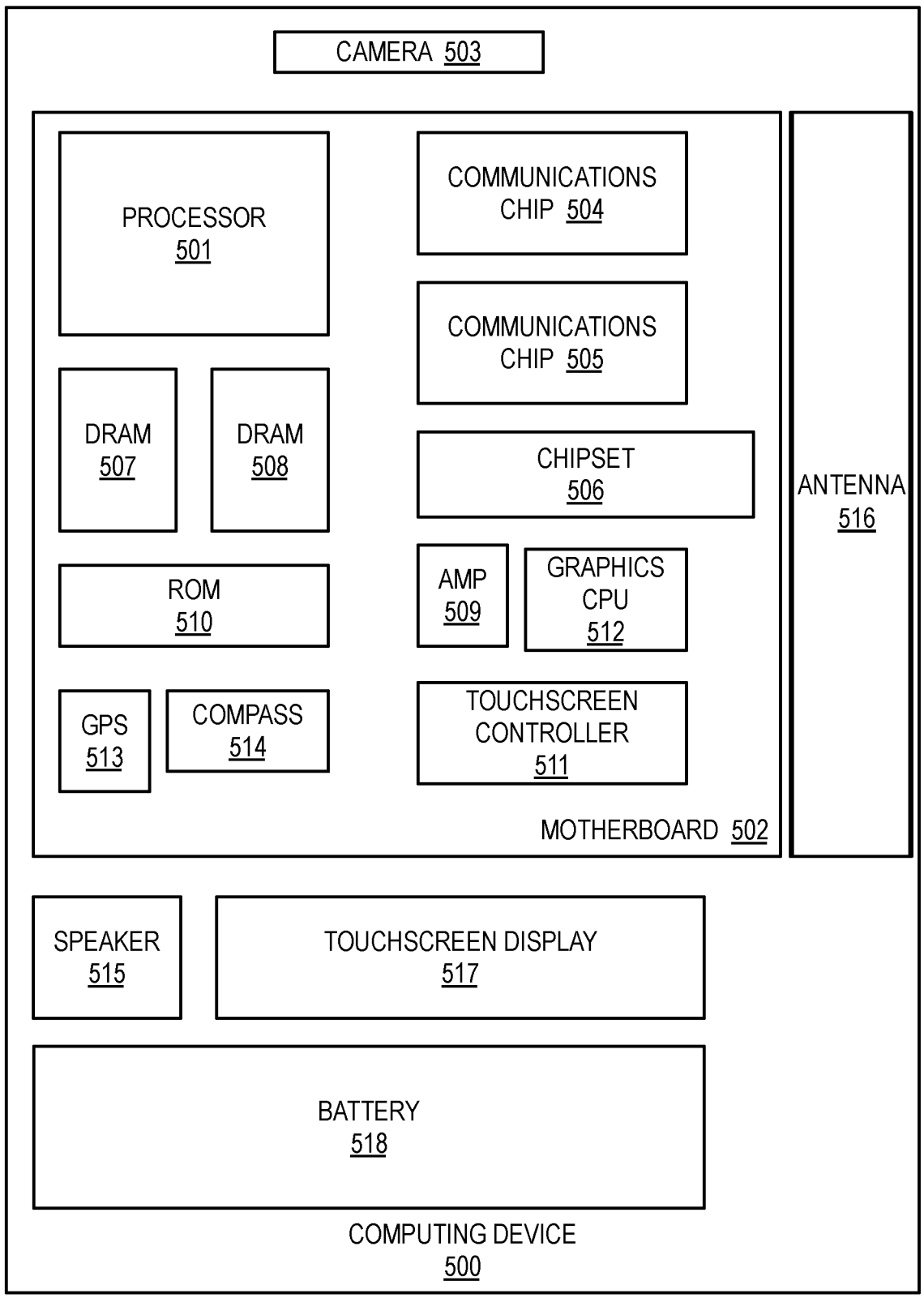
FIG. 5 illustrates a computing device in accordance with embodiments of the present disclosure.

FIG. 5 illustrates a computing device 500 in accordance with embodiments of the present disclosure. As shown, computing device 500 houses a motherboard 502. Motherboard 502 may include a number of components, including but not limited to a processor 501 and at least one communications chip 505. Processor 501 is physically and electrically coupled to the motherboard 502. In some implementations, communications chip 505 is also physically and electrically coupled to motherboard 502. In further implementations, communications chip 505 is part of processor 501.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset 506, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 505 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 505 may implement any of a number of wireless standards or protocols, including but not limited to Wi-Fi (IEEE 802.6 family), WiMAX (IEEE 802.6 family), IEEE 802.5, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communications chips 504 and 505. For instance, a first communications chip 505 may be dedicated to shorter range wireless communications such as Wi-Fi and Bluetooth and a second communications chip 504 may be dedicated to longer range wireless communications such as GPS, EDGE, GPRS, CDMA, WiMAX, LTE, Ev-DO, and others.

Processor 501 of the computing device 500 includes an integrated circuit die packaged within processor 501. In some embodiments, the integrated circuit die of processor 501 includes one or more memory devices, such as SOT memory devices 50A and 50B, described in association with FIGS. 1A, 1B, 1C and 1D, in accordance with embodiments of the present disclosure. The term "processor" may refer to any device or portion of a device that processes electronic data from registers and/or memory to transform that electronic data into other electronic data that may be stored in registers and/or memory.

Communications chip 505 also includes an integrated circuit die packaged within communications chip 505. In another embodiment, the integrated circuit die of communications chips 504, 505 include a memory array with memory cells including at least one memory device such as a memory device 100 including a MTJ device 104 on a conductive layer including Ru and W.

In various examples, one or more communications chips 504, 505 may also be physically and/or electrically coupled to the motherboard 502. In further implementations, communications chips 504 may be part of processor 501. Depending on its applications, computing device 500 may include other components that may or may not be physically and electrically coupled to motherboard 502. These other components may include, but are not limited to, volatile memory (e.g., DRAM) 507, 508, non-volatile memory (e.g., ROM) 510, a graphics CPU 512, flash memory, global positioning system (GPS) device 513, compass 514, a chipset 506, an antenna 516, a power amplifier 506, a touchscreen controller 511, a touchscreen display 517, a speaker 515, a camera 503, and a battery 518, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 500 and discussed above may contain a stand-alone integrated circuit memory die that includes one or more arrays of memory cells including one or more memory devices, such as a memory device 100, including a MTJ device 104 on a conductive layer including Ru and W, built in accordance with embodiments of the present disclosure.

In various implementations, the computing device 500 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, IOT device in automotive applications or a digital video recorder. In further implementations, the computing device 500 may be any other electronic device that processes data.

Figure 6:
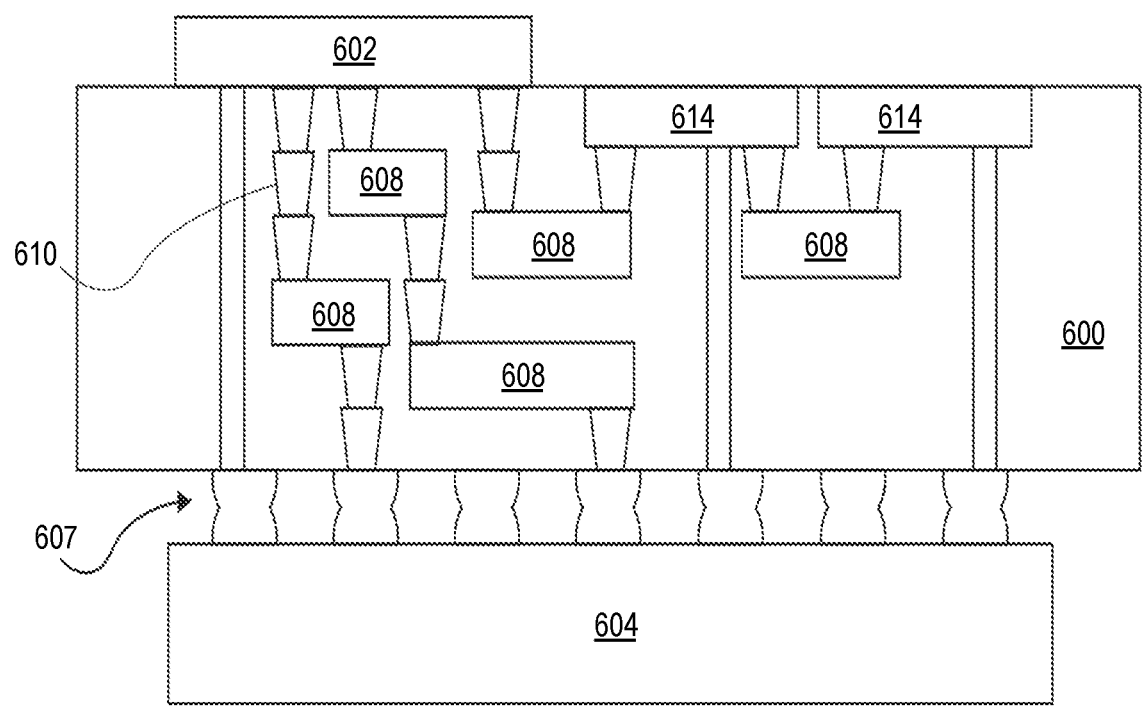
FIG. 6 illustrates an integrated circuit (IC) structure that includes one or more embodiments of the present disclosure.

FIG. 6 illustrates an integrated circuit (IC) structure 600 that includes one or more embodiments of the disclosure. The integrated circuit (IC) structure 600 is an intervening substrate used to bridge a first substrate 602 to a second substrate 604. The first substrate 602 may be, for instance, an integrated circuit die. The second substrate 604 may be, for instance, a memory module, a computer mother, or another integrated circuit die. Generally, the purpose of an integrated circuit (IC) structure 600 is to spread a connection to a wider pitch or to reroute a connection to a different connection. For example, an integrated circuit (IC) structure 600 may couple an integrated circuit die to a ball grid array (BGA) 607 that can subsequently be coupled to the second substrate 604. In some embodiments, the first and second substrates 602/604 are attached to opposing sides of the integrated circuit (IC) structure 600. In other embodiments, the first and second substrates 602/604 are attached to the same side of the integrated circuit (IC) structure 600. And in further embodiments, three or more substrates are interconnected by way of the integrated circuit (IC) structure 600.

The integrated circuit (IC) structure 600 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 608 and vias 610, including but not limited to through-silicon vias (TSVs) 610. The integrated circuit (IC) structure 600 may further include embedded devices 614, including both passive and active devices. Such devices include, but are not limited to, capacitors, decoupling capacitors, resistors, inductors, fuses, diodes, transformers, device structure including transistors, such as a transistor 601 (described in association with FIG. 6, not shown in FIG. 6) coupled with a with one at least one memory device such as the memory device 100 which includes a conductive layer 102 including an alloy of ruthenium and tungsten between a bottom electrode 101 and a MTJ stack 104. The integrated circuit (IC) structure 600 may further include embedded devices 614 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 600. In accordance with embodiments of the present disclosure, apparatuses or processes disclosed herein may be used in the fabrication of integrated circuit (IC) structure 600.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a perpendicular magnetic tunnel junction memory device such as the pMTJ device 100. The pMTJ device 100 may be used in embedded non-volatile memory applications.

Thus, embodiments of the present disclosure include magnetic memory devices and methods to form the same.

In a first example, a memory device, includes a bottom electrode, a conductive layer including an alloy of ruthenium and tungsten above the bottom electrode, a magnetic tunnel junction (MTJ) on the conductive layer, where the MTJ includes a fixed magnet a free magnet and a tunnel barrier between the fixed and the free magnet.

In second examples, for any of first examples, the conductive layer includes 5-70 atomic percent of tungsten.

In third examples, for any of the first through second examples, the balance of the conductive layer is predominantly ruthenium.

In fourth examples, for any of the first through second examples, the balance of the conductive layer is not more than 50% tungsten and the balance is substantially ruthenium.

In fifth examples, for any of the first through fourth examples, the conductive layer is on a layer of predominantly tungsten.

In sixth examples, for any of the first through fifth examples, the memory device further includes a layer of ruthenium on the conductive layer.

In seventh examples, for any of the first through sixth examples, the memory device further includes a layer of ruthenium on the conductive layer, wherein the conductive layer is on a layer of predominantly tungsten.

In eighth examples, for any of the first through fifth examples, layer of predominantly W is a first layer of a bilayer further including a second layer, the second layer further including predominantly ruthenium.

In ninth examples, for any of the first through eighth examples, the bilayer is one of plurality of bilayers, wherein the number of bi layers ranges between 1 and 10.

In tenth examples, for any of the first through ninth examples, the layer of tungsten has a thickness between 0.05 nm and 2 nm and the layer of ruthenium has a thickness between 0.4 nm and 1 nm.

In eleventh examples, for any of the first through tenth examples, the memory device further includes a seed layer on the first electrode, wherein the seed layer has a FCC <111> crystal texture.

In twelfth examples, for any of the eleventh example, the seed layer includes platinum and has a thickness between 0.2 nm and 5 nm.

In thirteenth examples, for any of the first through twelfth examples, a method of fabricating a includes forming a bottom electrode layer, forming a conductive layer including ruthenium and tungsten and forming a seed layer on the conductive layer. The method further includes forming a material layer stack on the bottom electrode layer, where the forming includes forming a fixed magnetic layer above the bottom electrode layer, forming a tunnel barrier layer on fixed magnetic layer and forming a first free magnetic layer on the tunnel barrier layer. The forming further includes forming a top electrode layer on the material layer stack and etching the material layer stack to form a memory device.

In a fourteenth example, for any of the thirteenth example, forming conductive layer includes co-sputter depositing tungsten and ruthenium to form an alloy on the bottom electrode layer.

In a fifteenth example, for any of the thirteenth through fifteenth examples, forming conductive layer includes sputter depositing from a tungsten and ruthenium alloy target to form an alloy on the bottom electrode layer.

In sixteenth examples, for any of the for any of the thirteenth through fifteenth examples, forming conductive layer includes depositing alternating layers of tungsten and ruthenium followed by annealing to form an alloy.

In seventeenth examples, system includes a transistor above a substrate, where the transistor includes a drain contact coupled to a drain, a source contact coupled to a source, a gate contact coupled to a gate and a bottom electrode coupled to the drain contact.

In eighteenth examples, for any of the seventeenth examples, the bottom electrode is above the drain contact, and wherein the fixed magnet is above the bottom electrode, the tunnel barrier is above the fixed magnet and the free magnet is above the tunnel barrier.

In nineteenth examples, for any of the seventeenth through eighteenth examples, the system further includes a power supply coupled to the transistor.

What is claimed is:

1. A memory device, comprising:
   a bottom electrode;
   a conductive layer comprising an alloy of ruthenium and tungsten above the bottom electrode, wherein the conductive layer is not more than 50 atomic percent tungsten and the balance is substantially ruthenium and tungsten concentration within the conductive layer decreases with greater distance from the bottom electrode; and
   a magnetic tunnel junction (MTJ) on the conductive layer, the MTJ comprising:
      a free magnet;
      a fixed magnet between the free magnet and the conductive layer;
      a synthetic antiferromagnetic (SAF) structure between the fixed magnet and the conductive layer;
      a seed layer between the SAF structure and the conductive layer; and
      a tunnel barrier between the fixed magnet and the free magnet.

2. The memory device of claim 1, wherein the conductive layer comprises at least 5 atomic percent of tungsten.

3. The memory device of claim 1, further comprising a layer of predominantly tungsten between the conductive layer and the bottom electrode.

4. The memory device of claim 3, wherein the layer of predominantly tungsten is a first layer of a bilayer further comprising a second layer, the second layer further comprising predominantly ruthenium.

5. The memory device of claim 4, wherein the bilayer is one of plurality of bilayers, and wherein the number of bilayers ranges between 1 and 10.

6. The memory device of claim 4, wherein the layer of tungsten has a thickness between 0.05 nm and 2 nm and the layer of ruthenium has a thickness between 0.4 nm and 1 nm.

7. The memory device of claim 1, further comprising a layer of ruthenium between the conductive layer and the seed layer.

8. The memory device of claim 1, further comprising a layer of ruthenium between the conductive layer and the seed layer, and further comprising a layer of predominantly tungsten between the conductive layer and the bottom electrode.

9. The memory device of claim 1, wherein the seed layer has FCC <111>crystal texture and the bottom electrode has cubic <001>crystal texture.

10. The memory device of claim 9, wherein the seed layer comprises platinum and has a thickness between 0.2 nm and 5 nm, and wherein the bottom electrode comprises Ta or TiN.

11. A system, comprising:
    a transistor above a substrate, the transistor comprising:
       a drain contact coupled to a drain;
       a source contact coupled to a source;
       a gate contact coupled to a gate;
    a memory device, the memory device comprising:
       a bottom electrode coupled with the drain contact;
       a conductive layer comprising an alloy of ruthenium and tungsten above the bottom electrode, wherein the conductive layer is not more than 50 atomic percent
    tungsten and the balance is substantially ruthenium and tungsten concentration within the conductive layer decreases with greater distance from the bottom electrode;
       a magnetic tunnel junction (MTJ) over the conductive layer, the MTJ comprising:
          a free magnet; and
          a fixed magnet between the free magnet and the conductive layer;
          a synthetic antiferromagnetic (SAF) structure between the fixed magnet and the conductive layer;
          a seed layer between the SAF structure and the conductive layer; and
          a tunnel barrier between the fixed magnet and the free magnet.

12. The system of claim 11, wherein the bottom electrode is above the drain contact, and wherein the fixed magnet is above the bottom electrode, the tunnel barrier is above the fixed magnet and the free magnet is above the tunnel barrier.

13. The system of claim 11, further comprising a power supply coupled to the transistor.

14. The system of claim 11, wherein the seed layer has FCC <111>crystal texture and the bottom electrode has cubic <001>crystal texture.

* * * * *